United States Patent
Hirayama et al.

(10) Patent No.: US 8,069,558 B2
(45) Date of Patent: Dec. 6, 2011

(54) METHOD FOR MANUFACTURING SUBSTRATE HAVING BUILT-IN COMPONENTS

(75) Inventors: Katsuro Hirayama, Otsu (JP); Shigeo Nishimura, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 82 days.

(21) Appl. No.: 12/640,264

(22) Filed: Dec. 17, 2009

(65) Prior Publication Data

US 2010/0083495 A1    Apr. 8, 2010

Related U.S. Application Data

(63) Continuation of application No. PCT/JP2008/058637, filed on May 9, 2008.

(30) Foreign Application Priority Data

Jun. 26, 2007   (JP) ................. 2007-167076

(51) Int. Cl.
*H05K 3/30* (2006.01)
*H05K 3/20* (2006.01)
*H05K 13/00* (2006.01)
*H05K 1/00* (2006.01)
*H05K 1/18* (2006.01)
*H05K 7/00* (2006.01)
*H01R 43/00* (2006.01)

(52) U.S. Cl. ............. 29/832; 29/831; 29/841; 29/854; 29/855; 174/250; 361/748; 361/760; 361/761

(58) Field of Classification Search ............. 29/832, 29/831, 834, 841, 842, 846, 847, 854, 855, 29/874; 174/250, 251, 255, 256, 260; 361/748, 361/760, 761, 762
See application file for complete search history.

(56) References Cited

U.S. PATENT DOCUMENTS

| 6,038,133 | A  | * | 3/2000 | Nakatani et al. | 361/760 |
| 6,329,715 | B1 | * | 12/2001 | Hayashi | 257/724 |
| 6,338,767 | B1 | * | 1/2002 | Nakatani et al. | 156/233 |
| 6,366,192 | B2 | * | 4/2002 | Person et al. | 336/200 |

(Continued)

FOREIGN PATENT DOCUMENTS

JP    11-220262 A    8/1999

(Continued)

OTHER PUBLICATIONS

Official Communication issued in International Patent Application No. PCT/JP2008/058637, mailed on Jun. 24, 2008.

(Continued)

*Primary Examiner* — David Angwin
(74) *Attorney, Agent, or Firm* — Keating & Bennett, LLP

(57) ABSTRACT

A method for manufacturing a substrate having built-in components prevents a short circuit caused by the spread of solder or conductive adhesive. Land regions to connect a circuit component and a wetting prevention region surrounding the land regions are formed on one primary surface of a metal foil. Terminal electrodes of the circuit component are electrically connected to the land regions using solder, and an uncured resin is disposed on and pressure bonded to the metal foil and the circuit component, so that a resin layer in which the circuit component is embedded is formed. Subsequently, a wiring pattern is formed by processing the metal foil. The wetting prevention region is a region obtained by roughening or oxidizing one primary surface of the metal foil so as to reduce solder wettability.

12 Claims, 9 Drawing Sheets

U.S. PATENT DOCUMENTS

| | | | | |
|---|---|---|---|---|
| 6,379,781 | B1* | 4/2002 | Suzuki et al. | 428/209 |
| 6,489,685 | B2* | 12/2002 | Asahi et al. | 257/774 |
| 6,538,210 | B2* | 3/2003 | Sugaya et al. | 174/258 |
| 6,570,469 | B2* | 5/2003 | Yamada et al. | 333/193 |
| 6,596,384 | B1* | 7/2003 | Day et al. | 428/212 |
| 6,625,037 | B2* | 9/2003 | Nakatani et al. | 361/762 |
| 6,734,542 | B2* | 5/2004 | Nakatani et al. | 257/687 |
| 6,784,530 | B2* | 8/2004 | Sugaya et al. | 257/686 |
| 6,784,765 | B2* | 8/2004 | Yamada et al. | 333/193 |
| 6,798,121 | B2* | 9/2004 | Nakatani et al. | 310/340 |
| 6,855,892 | B2* | 2/2005 | Komatsu et al. | 174/256 |
| 6,860,004 | B2* | 3/2005 | Hirano et al. | 29/832 |
| 6,903,458 | B1* | 6/2005 | Nathan | 257/737 |
| 6,931,725 | B2* | 8/2005 | Sugaya et al. | 29/852 |
| 6,939,738 | B2* | 9/2005 | Nakatani et al. | 438/108 |
| 6,955,948 | B2* | 10/2005 | Asahi et al. | 438/125 |
| 6,961,245 | B2* | 11/2005 | Ikuta et al. | 361/719 |
| 6,974,724 | B2* | 12/2005 | Hyvonen et al. | 438/107 |
| 6,975,516 | B2* | 12/2005 | Asahi et al. | 361/761 |
| 6,985,364 | B2* | 1/2006 | Higashitani et al. | 361/763 |
| 6,991,966 | B2* | 1/2006 | Tuominen | 438/118 |
| 7,006,359 | B2* | 2/2006 | Galvagni et al. | 361/761 |
| 7,018,866 | B2* | 3/2006 | Sugaya et al. | 438/108 |
| 7,038,310 | B1* | 5/2006 | Nakatani et al. | 257/706 |
| 7,047,634 | B2* | 5/2006 | Nakamura | 29/832 |
| 7,059,042 | B2* | 6/2006 | Hirano et al. | 29/832 |
| 7,061,100 | B2* | 6/2006 | Iwaki et al. | 257/706 |
| 7,068,519 | B2* | 6/2006 | Nakatani et al. | 361/762 |
| 7,091,716 | B2* | 8/2006 | Nakamura | 324/754.03 |
| 7,094,676 | B1* | 8/2006 | Leu et al. | 438/611 |
| 7,126,811 | B2* | 10/2006 | Hirano et al. | 361/523 |
| 7,134,198 | B2* | 11/2006 | Nakatani et al. | 29/841 |
| 7,141,874 | B2* | 11/2006 | Nakatani | 257/700 |
| 7,165,321 | B2* | 1/2007 | Kondo et al. | 29/832 |
| 7,180,169 | B2* | 2/2007 | Ishimaru et al. | 257/690 |
| 7,190,080 | B1* | 3/2007 | Leu et al. | 257/778 |
| 7,198,996 | B2* | 4/2007 | Nakatani et al. | 438/184 |
| 7,217,999 | B1* | 5/2007 | Honda | 257/712 |
| 7,235,148 | B2* | 6/2007 | Day et al. | 156/153 |
| 7,247,178 | B2* | 7/2007 | Hirano et al. | 29/25.03 |
| 7,248,482 | B2* | 7/2007 | Asahi et al. | 361/790 |
| 7,264,991 | B1* | 9/2007 | Lin | 438/106 |
| 7,284,311 | B2* | 10/2007 | Nakamura | 29/593 |
| 7,285,728 | B2* | 10/2007 | Sunohara et al. | 174/260 |
| 7,285,862 | B2* | 10/2007 | Sunohara et al. | 257/774 |
| 7,294,529 | B2* | 11/2007 | Tuominen | 438/107 |
| 7,294,587 | B2* | 11/2007 | Asahi et al. | 438/782 |
| 7,297,876 | B2* | 11/2007 | Sakurai et al. | 174/260 |
| 7,299,546 | B2* | 11/2007 | Tuominen et al. | 29/840 |
| 7,307,852 | B2* | 12/2007 | Inagaki et al. | 361/760 |
| 7,319,599 | B2* | 1/2008 | Hirano et al. | 361/763 |
| 7,358,591 | B2* | 4/2008 | Horikawa et al. | 257/532 |
| 7,394,663 | B2* | 7/2008 | Yamashita et al. | 361/766 |
| 7,400,512 | B2* | 7/2008 | Hirano et al. | 361/763 |
| 7,416,996 | B2* | 8/2008 | Japp et al. | 438/763 |
| 7,417,196 | B2* | 8/2008 | Wada et al. | 174/260 |
| 7,443,021 | B2* | 10/2008 | Nakatani | 257/700 |
| 7,488,895 | B2* | 2/2009 | Hayashi et al. | 174/255 |
| 7,498,200 | B2* | 3/2009 | Sunohara et al. | 438/108 |
| 7,508,076 | B2* | 3/2009 | Japp et al. | 257/762 |
| 7,514,636 | B2* | 4/2009 | Sasaki | 174/252 |
| 7,563,987 | B2* | 7/2009 | Sunohara et al. | 174/260 |
| 7,564,137 | B2* | 7/2009 | Lam | 257/774 |
| 7,573,135 | B2* | 8/2009 | Sunohara et al. | 257/774 |
| 7,594,316 | B2* | 9/2009 | Noda et al. | 29/830 |
| 7,609,527 | B2* | 10/2009 | Tuominen et al. | 361/761 |
| 7,615,856 | B2* | 11/2009 | Sakai et al. | 257/686 |
| 7,658,988 | B2* | 2/2010 | Lin et al. | 428/209 |
| 7,663,215 | B2* | 2/2010 | Tuominen et al. | 257/686 |
| 7,673,387 | B2* | 3/2010 | Tuominen et al. | 29/852 |
| 7,679,925 | B2* | 3/2010 | Fukuoka et al. | 361/761 |
| 7,684,207 | B2* | 3/2010 | Noda et al. | 361/795 |
| 7,719,851 | B2* | 5/2010 | Tuominen et al. | 361/761 |
| 7,732,909 | B2* | 6/2010 | Tuominen | 257/687 |
| 7,745,938 | B2* | 6/2010 | Nakasato et al. | 257/773 |
| 7,759,583 | B2* | 7/2010 | Murai et al. | 174/266 |
| 7,768,795 | B2* | 8/2010 | Sakurai et al. | 361/790 |
| 7,785,932 | B2* | 8/2010 | Droz | 438/127 |
| 7,791,120 | B2* | 9/2010 | Usui et al. | 257/296 |
| 7,795,717 | B2* | 9/2010 | Goller | 257/686 |
| 7,855,894 | B2* | 12/2010 | Inagaki et al. | 361/763 |
| 7,874,066 | B2* | 1/2011 | Hiroshi et al. | 29/831 |
| 2002/0117743 | A1* | 8/2002 | Nakatani et al. | 257/687 |
| 2004/0158980 | A1* | 8/2004 | Nakatani et al. | 29/852 |
| 2005/0230848 | A1* | 10/2005 | Nakatani et al. | 257/783 |

FOREIGN PATENT DOCUMENTS

| | | |
|---|---|---|
| JP | 2000-236144 A | 8/2000 |
| JP | 2001-298033 A | 10/2001 |
| JP | 2002-246501 A | 8/2002 |
| JP | 2002-261449 A | 9/2002 |
| JP | 2003-234432 A | 8/2003 |
| JP | 2005-026573 A | 1/2005 |
| JP | 2005026573 * | 1/2005 |

OTHER PUBLICATIONS

Official Communication issued in corresponding Japanese Patent Application No. 2009-520395, mailed on Aug. 23, 2011.

* cited by examiner

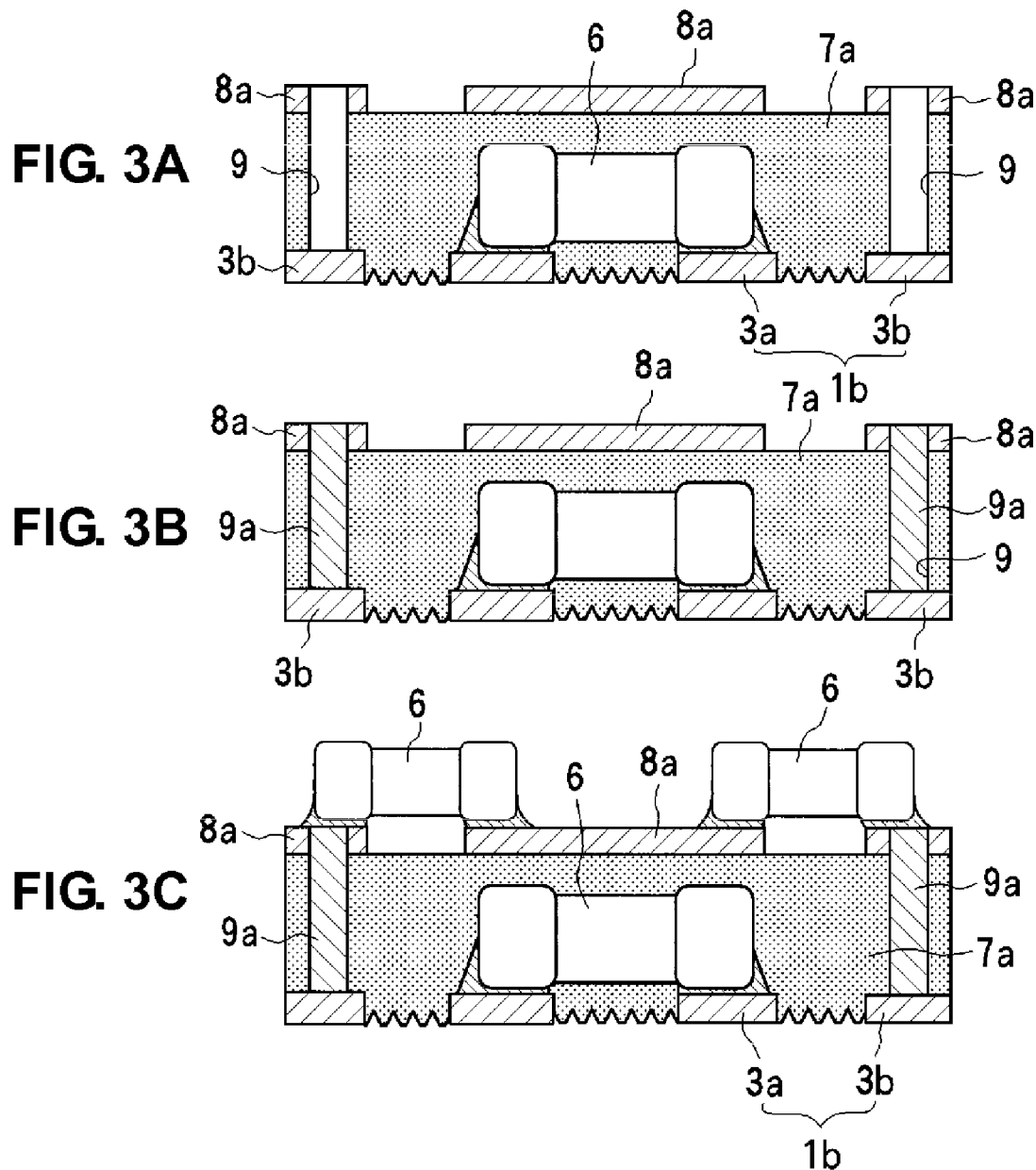

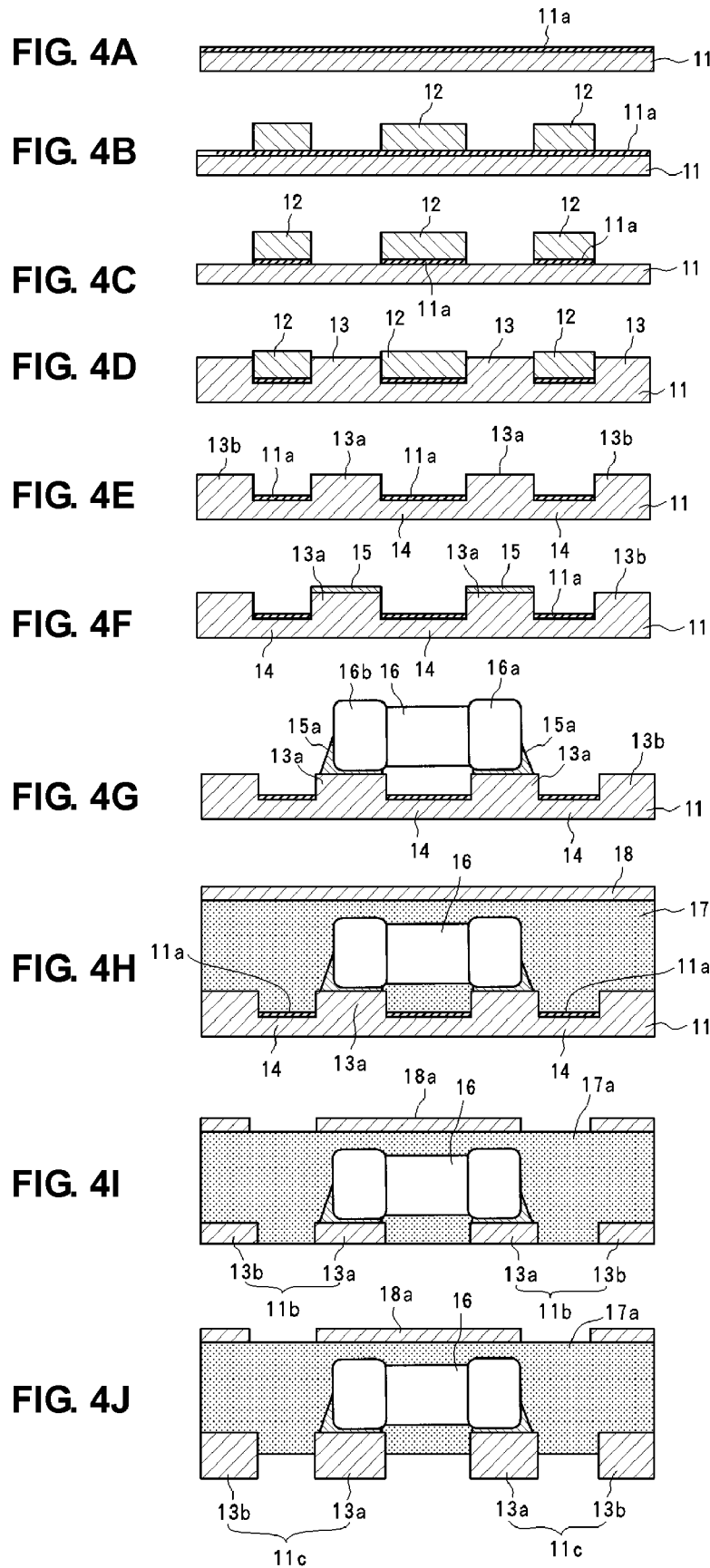

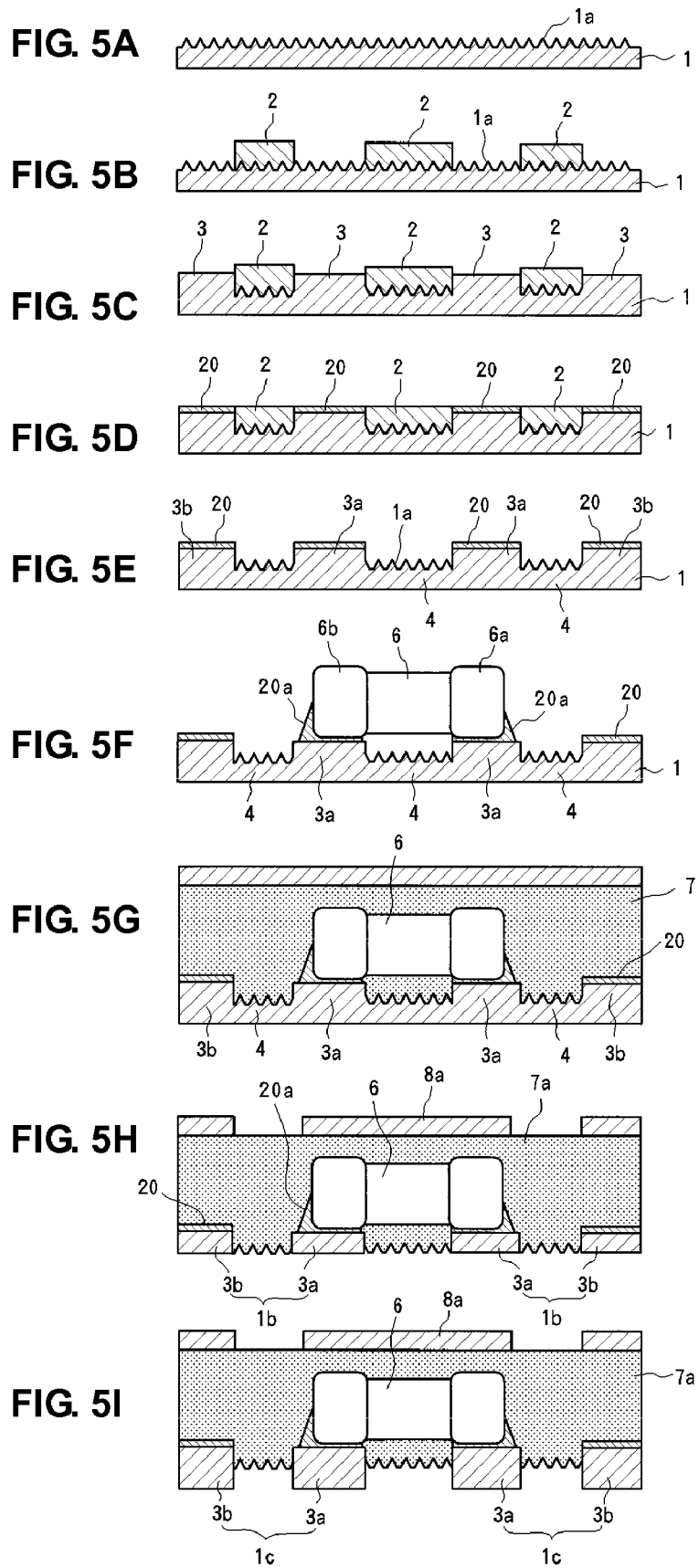

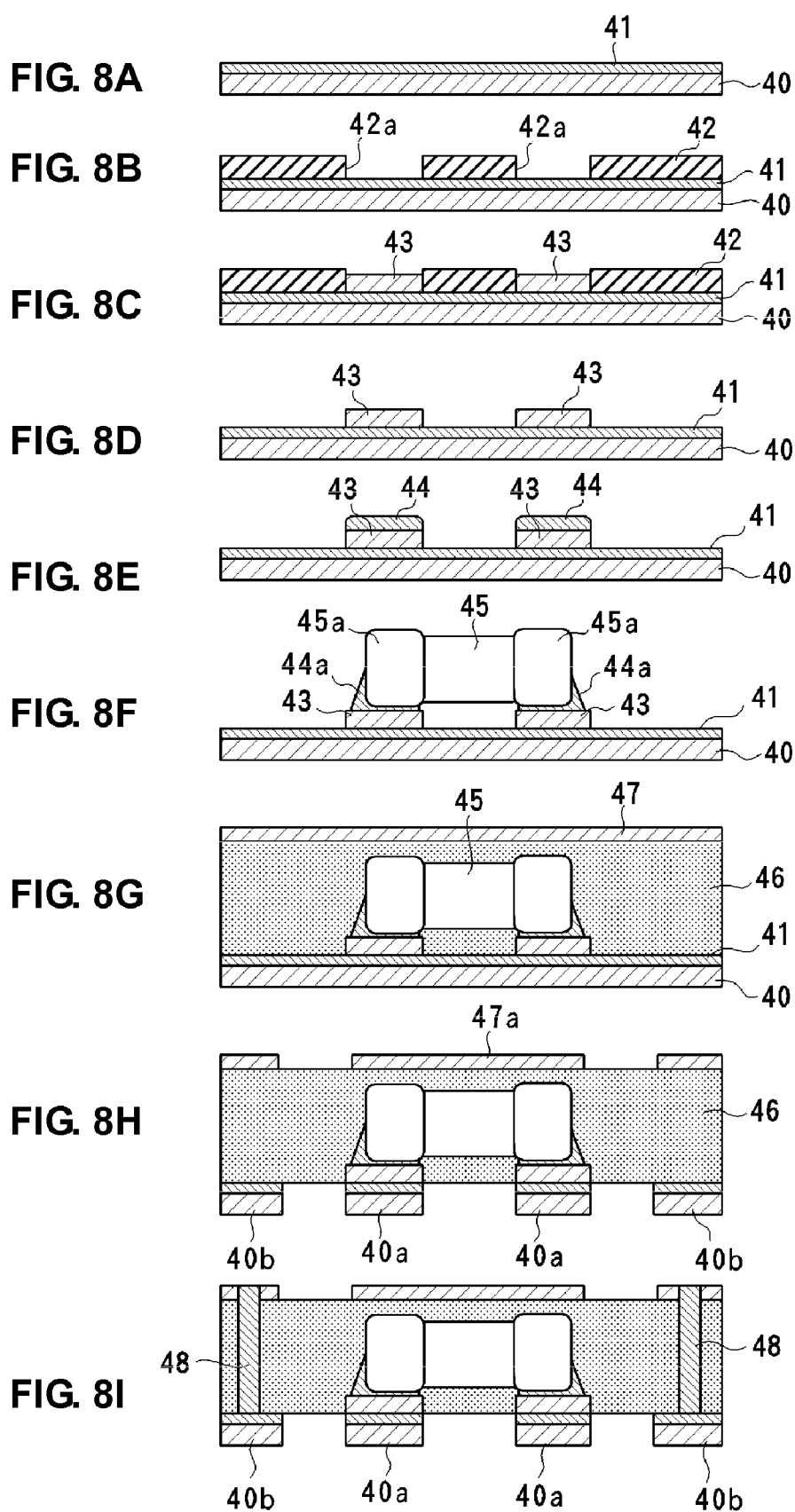

METHOD FOR MANUFACTURING SUBSTRATE HAVING BUILT-IN COMPONENTS

BACKGROUND OF THE INVENTION

1. Field of the Invention

The present invention relates to a method for manufacturing a substrate having built-in components in which at least one circuit component is embedded in a resin layer.

2. Description of the Related Art

Recently, as a result of the trend toward reducing the size of electronic apparatuses, a reduction in the size of circuit substrates which are used to mount circuit components, such as a chip capacitor, has been required. In response, the reduction in the size of circuit substrates has been achieved by embedding circuit components in a circuit substrate to form a module so that the mounting areas of the circuit components are reduced. Since a substrate having built-in components in which circuit components are embedded in a resin substrate is lightweight and is not subjected to high temperature firing, unlike a ceramic substrate, there is an advantage in that the type of circuit component to be embedded in the substrate is not particularly limited.

In Japanese Unexamined Patent Application Publication No. 11-220262, a method for manufacturing a substrate having built-in components is disclosed in which after circuit components are mounted on a metal foil with conductive adhesives interposed therebetween, and a resin sheet made of an inorganic filler and a thermosetting resin is disposed on and pressure bonded to the metal foil, the resin sheet is thermally cured to form a resin layer in which the circuit components are embedded therein, and subsequently the metal foil is processed to form a wiring pattern.

However, in the manufacturing method described above, when the circuit components are mounted, or the resin sheet is pressure bonded, since the conductive adhesives are spread in a primary surface direction of the metal foil, the conductive adhesives are brought into contact with each other or are brought into contact with adjacent wiring patterns, so that a short circuit may occur. The same problem also occurs when a solder is used instead of the conductive adhesive. For example, when reflow soldering is performed to mount circuit components, since a melted solder is spread in a primary surface direction of the metal foil, a short circuit may occur between adjacent lands. In particular, when a substrate having built-in components is formed to have a multilayer structure, since heat generated in a reflow process is applied a plurality of times to a circuit component which is mounted first, a solder is re-melted, so that solder spreading may occur.

In Japanese Unexamined Patent Application Publication No. 2005-26573, a method for manufacturing a substrate having built-in components is disclosed in which an insulating layer having opening portions is formed on one primary surface of a metal foil so as to prevent the spread of solder or a conductive adhesive.

FIGS. 9A to 9E show an example of the method for manufacturing a substrate having built-in components disclosed in Japanese Unexamined Patent Application Publication No. 2005-26573. Hereinafter, with reference to FIGS. 9A to 9E, a conventional method for manufacturing a substrate having built-in components will be described.

As shown in FIG. 9A, an insulating layer 52 having opening portions 52a is formed on a metal foil 51 so that the metal foil 51 is partially exposed through the opening portions 52a.

Next, as shown in FIG. 9B, solder 53 is filled in the opening portions 52a.

Next, as shown in FIG. 9C, a circuit component 54 is disposed on the insulating layer 52 so that terminal electrodes 54a of the circuit component 54 are brought into contact with the solder 53, and the solder 53 are connected to the terminal electrodes 54a by soldering.

Next, as shown in FIG. 9D, a resin sheet made of an inorganic filler and a thermosetting resin is disposed on and pressure bonded to the insulating layer 52 and the circuit component 54, so that a resin layer 55 in which the circuit component 54 is embedded is formed. In addition, when the resin layer 55 is formed, a metal foil 56 arranged at a rear surface side is simultaneously bonded thereto.

Finally, the front and rear metal foils 51 and 56 are processed, so that wiring patterns 51a and 56a are formed.

In the above-described manufacturing method, the opening 52a formed in the insulating layer 52 functions as an enclosure to prevent the spread of the solder 53. However, since the solder 53 or a conductive adhesive must be filled in the opening portion 52a, a relatively large amount of solder or conductive adhesive is required. In particular, when a solder is used, since the amount thereof is large, solder flow is very likely to occur, and thus, a reliability problem may arise. In addition, when the resin layer 55 and the insulating layer 52 are made of different materials, an adhesion strength therebetween will decrease at the interface, and thereby solder flow may be generated. In recent years, as a result of the trend toward reducing the size and increasing the density, the distance between lands which mount a component embedded in a substrate having built-in components has been significantly decreased. Thus, a high solder-flow resistance is required.

SUMMARY OF THE INVENTION

To overcome the problems described above, preferred embodiments of the present invention provide a method for manufacturing a highly reliable substrate having built-in components which can prevent a short circuit caused by the spread of solder or conductive adhesive.

A preferred embodiment of the present invention provides a method for manufacturing a substrate having built-in components which includes a step (a) of forming land regions to connect at least one circuit component and a wetting prevention region on one primary surface of a metal foil, the wetting prevention region surrounding the land regions and having an inferior wettability to solder or conductive adhesive as compared to that of the land regions, a step (b) of electrically connecting terminal electrodes of the circuit component to the land regions using the solder or the conductive adhesive, a step (c) of forming a resin layer on the metal foil and the circuit component so that the circuit component is embedded in the resin layer, and a step (d) of processing the metal foil to form a wiring pattern.

In the manufacturing method according to a preferred embodiment of the present invention, first of all, land regions to connect a circuit component and a wetting prevention region are formed on one primary surface of a metal foil. The land regions are portions which are to be electrically connected to terminal electrodes of the circuit component by solder or a conductive adhesive. The land regions are formed in accordance with the positions and the number of the terminal electrodes. The land regions are each preferably formed so as not to be connected to a plurality of terminal electrodes and are also each preferably formed to correspond to one of the terminal electrodes. In addition, wiring regions may preferably be appropriately formed and arranged so as to be connected to the land regions.

The wetting prevention region is a region having an inferior wettability to solder or a conductive adhesive as compared to that of the land regions, and for example, the wetting prevention region is preferably defined by a region in which one primary surface of the metal foil is roughened or oxidized, that is, a region defined by a roughened surface or an oxide film, or a region made of a metal having a relatively inferior wettability to solder or a conductive adhesive as compared to that of a metal forming the land regions may also be formed. An oxide film may also preferably be formed on a rough surface. The wetting prevention region made of a rough surface or an oxide film has properties in which, compared to the land regions, solder or conductive adhesive is not likely to spread by wetting. In addition, when the land regions are made of copper or a copper alloy, the wetting prevention region may preferably be made of cobalt, nickel, tungsten, molybdenum, aluminum, chromium, iron, zinc, or an alloy thereof, for example. The wetting prevention region may preferably surround the entire peripheries of the land regions, for example. However, when the wiring regions are formed so as to be connected to the land regions, the wetting prevention region may preferably surround the peripheries of the land regions except for portions to which the wiring regions are connected.

On the metal foil on which the land regions and the wetting prevention region are formed, the circuit component is mounted on the land regions, and the terminal electrodes of the circuit component and the land regions are electrically connected to each other by solder or a conductive adhesive. In this step, since the amount of solder or a conductive adhesive may be decreased to the minimum amount necessary to connect the terminal electrodes and the land regions, the overall amount of solder or conductive adhesive can be decreased. Furthermore, since the peripheries of the land regions are surrounded by the wetting prevention region, the spread of solder or a conductive adhesive can be effectively prevented, and the risk of a short circuit can be greatly reduced.

In addition, when an uncured resin is disposed on and pressure bonded to the metal foil and the circuit component, an insulating layer is not required unlike the prior art. Thus, a dissimilar interface, which is generated when an insulating layer and a resin layer are formed of different materials, is not present. Accordingly, even when the circuit component is fixed using solder, the risk of generating solder flow can be reduced.

As the resin layer, for example, a resin sheet made only from a thermosetting resin may preferably be used, or a resin sheet including an inorganic filler and a thermosetting resin may also preferably be used. However, in both cases, a resin sheet in a softened state or a semi-cured state (such as a B stage) is preferably disposed on and pressure bonded to the metal foil and the circuit component. In this case, the resin layer enters spaces between the metal foil and the circuit components and between the circuit components and also tightly adheres to the surface of the metal foil. In particular, when a vacuum press is performed in the pressure boding, air bubbles are prevented from being generated inside the resin layer, and in addition, the resin can be reliably filled in the spaces between the metal foil and the circuit components. When the wetting prevention region is defined by a rough surface or an oxide film having irregularities, the resin layer enters the minute irregularities on the surface of the wetting prevention region, so that a bonding force with the metal foil can be increased. Thus, a solder flow phenomenon (in the case in which solder is used) can be more reliably prevented. In addition, the resin layer may preferably be formed by injection molding or other suitable method.

When a rough surface is provided as the wetting prevention region, a forming method therefor is performed in which a rough surface is formed by roughening one primary surface of a metal foil, a plating resist layer is formed in a region on the rough surface corresponding to the wetting prevention region, a metal plating layer having a superior wettability to the solder or the conductive adhesive is formed on the rough surface in regions other than the region in which the plating resist layer is formed to form the land regions, and the plating resist layer is removed to form the wetting prevention region defined by the rough surface. In this method, since steps are formed between the land regions and the wetting prevention region, solder or a conductive adhesive on the land region can be effectively prevented from spreading to the wetting prevention region. Even if a small amount of solder or conductive adhesive spreads to the wetting prevention region, since the distance to an adjacent land region is increased, the risk of generating a short circuit can be significantly reduced. In addition, when the circuit component is mounted on the land regions, a predetermined space can be provided between the circuit component and the wetting prevention region located thereunder. Thus, when an uncured resin is pressure bonded, the resin can be easily filled under the component, so that the component can be enclosed in the resin. Therefore, when the metal foil is etched in a subsequent step in order to form a wiring pattern, the circuit component is prevented from being damaged by an etching solution.

When an oxide film is formed as the wetting prevention region, a forming method therefor is performed in which an oxide film is formed on one primary surface of a metal foil, a plating resist layer is formed in a region on the oxide film corresponding to the wetting prevention region, the oxide film in regions other than the region in which the plating resist layer is formed is removed, a metal plating film having a superior wettability to the solder or the conductive adhesive is formed in the regions in which the oxide film is removed to form the land regions, and the plating resist layer is then removed to form the wetting prevention region from the oxide film. In this method, as in the case in which the rough surface is formed, since the land regions are located at a position above that of the wetting prevention region (oxide film), solder or conductive adhesive on the land region can be effectively prevented from spreading to the wetting prevention region, and in addition, an uncured resin can be easily filled under the component. In addition, since an oxide film can be easily formed to have a predetermined thickness by a known method, such as a heat treatment or a chemical treatment, for example, a uniform wetting prevention region can be easily formed.

When a metal having a relatively inferior wettability to that of a metal forming the land regions is used as the wetting prevention region, the wetting prevention region may be formed such that a metal foil provided on one primary surface thereof with a metal which has an inferior wettability to solder or conductive adhesive is prepared, a plating resist layer is formed on the metal foil in a region corresponding to the wetting prevention region, a metal plating layer having a superior wettability to solder or conductive adhesive is formed on the metal foil in regions other than the region in which the plating resist layer is formed to form the land regions, and the plating resist layer is removed to form the wetting prevention region in which the metal having an inferior wettability to solder or conductive adhesive is exposed. In this method, since the land regions are also located at a position above that of the wetting prevention region, solder or conductive adhesive on the land region can be effectively prevented from spreading to the wetting prevention region, and in addition, an uncured resin can be easily filled under the component. In addition, since the land regions can be formed by a plating method, manufacturing can be performed at a low cost.

As a process for forming a wiring pattern by processing the metal foil, two types of methods may preferably be used. The first method is a method in which wiring regions are continuously formed from the land regions, and a predetermined thickness of the metal foil is removed by etching or polishing from the other primary surface thereof, so that a wiring pattern including the land regions and the wiring regions is formed. In this method, since the land regions and the wiring regions are located at the same or substantially the same height, the spread is restricted only in a direction toward the wiring regions and does not extend to other regions, such as the wetting prevention region, so that the risk of generating a short circuit can be reduced.

The second method is a method in which the land regions are formed to have a dispersed domain structure so that the wetting prevention region surrounds the entire or substantially the entire peripheries of the land regions, and the metal foil is pattern-etched so as to form a wiring pattern including the land regions and the wiring regions connected thereto. In this method, since steps are formed between the land regions and the wiring regions, and all regions other than the land regions are located at a lower position, solder or conductive adhesive on the land region can be more effectively prevented from spreading in a plane direction. As a pattern-etching method, for example, a subtractive method using photolithography and etching in combination may preferably be used.

In step (b), after Sn or Sn alloy, for example, which is a Pb-free solder material, is plated on the land regions to form pre-coat layers, pre-coat mounting of terminal electrodes of the circuit component may preferably be performed on the land regions. In this case, since the pre-coat layer is a thin film, and a very small amount of solder can be effectively used, the risk of generating solder flow can be further reduced.

When the metal foil is a copper foil, for example, and the metal plating layer is a copper plating layer or a copper-alloy plating layer, for example, since the metal foil and the metal plating layer are, made of the same type of material, the bonding performance therebetween is superior, and thus, for example, peeling is prevented.

According to preferred embodiments of the present invention, the land regions and the wetting prevention region surrounding the land regions are formed on one primary surface of the metal foil, the terminal electrodes of the circuit component are connected to the land regions using solder or conductive adhesive, and the resin layer is formed on the metal foil and the circuit component. Accordingly, the spread of solder or conductive adhesive can be restricted by the wetting prevention region, and further, the overall amount of solder or conductive adhesive used can be decreased as compared to that of a conventional method in which an insulating layer is used. Thus, the risk of generating solder flow and a short circuit can be greatly reduced. In addition, in the case of a conventional method in which an insulating layer and a resin layer are made of different materials, an adhesion strength at a dissimilar interface therebetween decreases, and as a result, problems such as solder flow may occur. However, in preferred embodiments of the present invention, since no insulating layer is required, the problems as described above are avoided.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 3A to 3C include views showing a second-half of a manufacturing process of the substrate having built-in components according to the first preferred embodiment of the present invention.

FIGS. 4A to 4J include views showing a manufacturing process of a substrate having built-in components according to a second preferred embodiment of the present invention.

FIGS. 5A to 5I include views showing a manufacturing process of a substrate having built-in components according to a third preferred embodiment of the present invention.

FIGS. 8A to 8I include views showing a manufacturing process of a substrate having built-in components according to a fifth preferred embodiment of the present invention.

DETAILED DESCRIPTION OF PREFERRED EMBODIMENTS

First Preferred Embodiment

Figure 1:
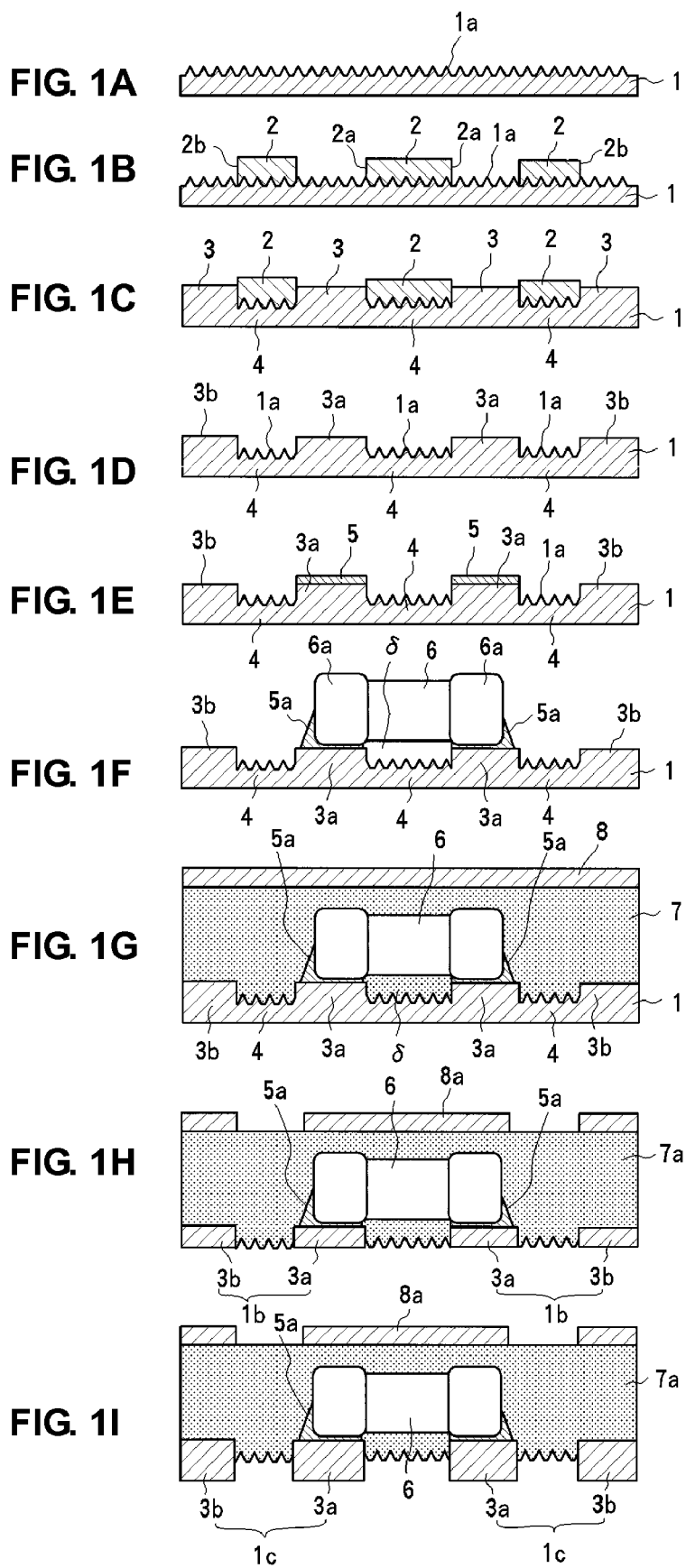
FIGS. 1A to 1I include views showing a first-half of a manufacturing process of a substrate having built-in components according to a first preferred embodiment of the present invention.

Hereinafter, a first preferred embodiment of a method for manufacturing a substrate having built-in components according to the present invention will be described with reference to FIGS. 1A to 1I. In order to simplify the illustration, FIGS. 1A to 1I show a portion of a manufacturing process of a substrate having built-in components in which only one circuit component is included. However, an actual substrate having built-in components includes a plurality of circuit components. Furthermore, in an actual manufacturing process, a substrate having built-in components is made in a mother substrate state and is then individually obtained therefrom by cutting the mother substrate.

FIG. 1A shows a first step in which a metal foil 1 having a rough surface 1a formed entirely or substantially entirely at one primary surface side is prepared. The metal foil 1 is processed in a subsequent eighth step which will be described later, so that a wiring pattern is formed on one surface of the substrate having built-in components. In this preferred embodiment, an example in which the rough surface 1a is formed over the metal foil 1 is described. However, as described later, the rough surface 1a may preferably be formed so as to at least include a region in which at least one circuit component 6 is mounted. As a material for the metal foil 1, for example, Cu, Ni, Al, or other suitable material may preferably be used. However, when workability and cost are taken into consideration, a Cu foil is most preferable. The thickness of the metal foil 1 is preferably in the range of about 5 μm to about 100 μm, for example. The surface roughness of the rough surface 1a is preferably a roughness that prevents the flow of solder or conductive adhesive which will be described later, and the ten-point surface roughness Rz preferably satisfies 1.0 μm≦Rz≦20 μm, for example. A method for roughening the surface of the metal foil 1 is not particularly limited, and a chemical treatment, such as etching, may preferably be used, or a mechanical treatment, such as polishing or blasting, may also preferably be used. In addition, when a Cu foil is used, a commercially available roughened Cu foil may also preferably be used.

FIG. 1B shows a second step in which a plating resist 2 is pattern-formed on the rough surface 1a of the metal foil 1. The plating resist 2 is formed in a region corresponding to a wetting prevention region 4 as described later. The plating resist 2 may preferably be formed, for example, such that after a resist film is laminated on the metal foil 1, an exposure and a development treatment are performed. In addition, the plating resist 2 may also be formed by another method, such as a screen printing method, for example. The thickness of the plating resist 2 is preferably set to be greater than that of a metal plating film 3 which will be described later and is preferably in the range of about 10 μm to about 50 μm, for example.

Figure 2:
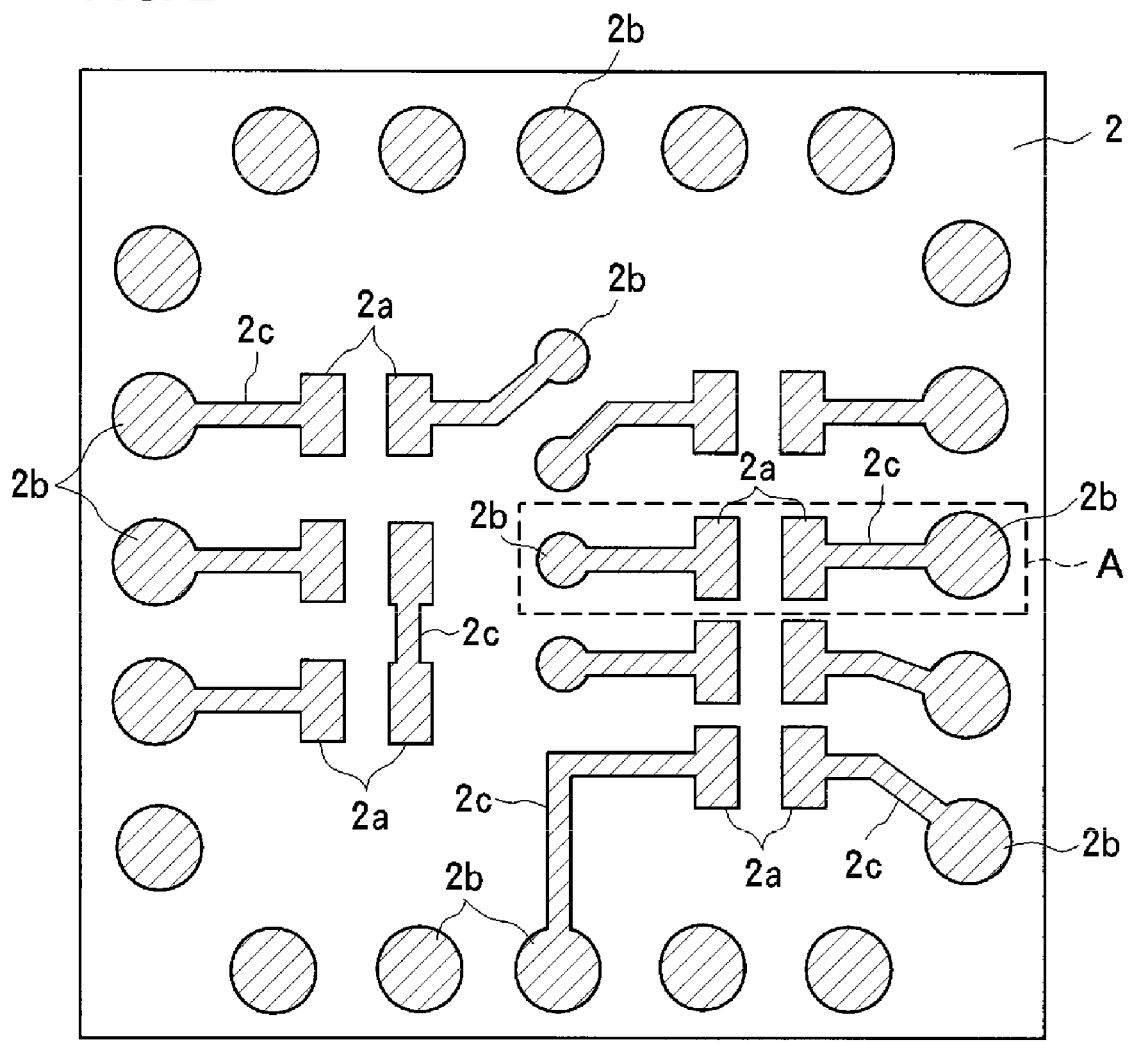
FIG. 2 is a pattern view showing an example of a plating resist.

FIG. 2 shows an example of a pattern shape of the plating resist 2. In the plating resist 2, opening portions 2a and 2b are formed at positions at which component-mounting land regions 3a and via land regions 3b are formed in a subsequent step which will be described later, and opening portions 2c are formed which are each used to form a wiring region connecting the opening portions 2a and 2b. FIG. 1B is a partial cross-sectional end view of FIG. 2 (indicated by the A portion in FIG. 2) and shows a cross section including no opening portion 2c used to form the wiring region. The land opening portions 2a are formed at positions corresponding to individual terminal electrodes of the circuit component 6 and are each preferably formed for the corresponding one of the terminal electrodes of the circuit component 6. In FIG. 2, for the via opening portions 2b, openings having two different diameters are formed, and the reason for this is that since via conductors having different diameters are used, the lands must have different sizes that conform therewith. Although the wiring opening portion 2c is configured to have a belt shape so as to connect between the land opening portion 2a and the via opening portion 2c or between the land opening portions 2a, the shape of the wiring opening portion 2c is optional. In this example, the wetting prevention region 4 is formed in a region other than the regions for the component-mounting land regions 3a, the via land regions 3b, and the wiring regions.

FIG. 1C shows a third step in which a metal plating layer 3 having a superior wettability to solder or conductive adhesive is formed on the rough surface 1a in regions other than the region in which the plating resist 2 is formed. This metal plating layer 3 is formed into the land regions and the wiring regions which will be described later. In addition, at the stage before the metal plating layer 3 is formed, the rough surface 1a in the regions other than the region in which the plating resist 2 is formed is preferably not oxidized. A material for the metal plating layer 3 is not particularly limited to Cu, Ni, and other suitable materials. However, in view of electrical properties and cost, Cu plating is most preferable. Any suitable plating method, such as an electroplating method or an electroless plating method, may preferably be used. The thickness of the metal plating layer 3 is preferably arranged so that the surface thereof extends higher than the peak of the rough surface 1a.

FIG. 1D shows a fourth step in which the plating resist 2 is removed from the metal foil 1. The plating resist 2 can be easily removed using a stripping solution, such as a NaOH solution, for example. Since the plating resist 2 is removed, the component-mounting land regions 3a, the via land regions 3b, and the wiring regions, each of which is made of the metal plating layer and has a flat surface, are formed on the metal foil 1, and the wetting prevention region 4 having a rough surface is formed at a lower side so as to surround the peripheries of the regions described above. That is, the land regions 3a and 3b and the wiring regions are formed at a position above that of the wetting prevention region 4.

FIG. 1E shows a fifth step in which a solder paste 5 is applied to the component-mounting land regions 3a on the metal foil 1. The application of the solder paste 5 can be easily performed by a known method, such as a printing method, for example. In addition, the solder paste 5 is not necessarily applied to the via land regions 3b and the wiring regions.

FIG. 1F shows a sixth step in which the circuit component 6 is disposed on the component-mounting land regions 3a to which the solder paste 5 is applied and is then mounted thereon by reflow or other suitable method. In this step, terminal electrodes 6a of the circuit component 6 and the land regions 3a are electrically connected to each other by solder 5a. When being melted, the solder 5a is filled by its own surface tension in a space between the terminal electrode 6a and the corresponding land region 3a, and at the same time, the solder 5a partially climbs a side surface of the terminal electrode 6a so that a fillet is formed. Since the solder 5a stays on the land region 3a due to its own surface tension, and further the land region 3a is formed at a position above that of the wetting prevention region 4, the solder 5a is not spread by wetting to the wetting prevention region 4 located outside. In addition, since the land region 3a is formed at a position above that of the wetting prevention region 4, when the circuit component 6 is mounted, a predetermined space δ in which a resin, which will be described later, can be easily filled is formed between the circuit component 6 and the wetting prevention region 4 located thereunder. In this preferred embodiment, the circuit component 6 is preferably a two-terminal chip component, for example. However, a multi-terminal electronic component, such as a three-terminal chip component or an integrated circuit, for example, may also be used.

In this preferred embodiment, although the example in which the circuit component 6 is mounted using the solder 5a on the component-mounting land regions 3a is described, the mounting may also be performed in a manner similar to that described above using a conductive adhesive instead of the solder 5a. However, when a conductive adhesive is used, in order to cure a thermosetting resin included therein, a thermal curing treatment must be performed.

FIG. 1G shows a seventh step in which a resin sheet 7 and a metal foil 8 are disposed on and pressure bonded to the metal foil 1 and the circuit component 6. The metal sheet 7 is preferably a semi-cured (such as a B-stage) sheet including, for example, an inorganic filler and a thermosetting resin. When being pressure bonded, the resin sheet 7 enters the space δ between the metal foil 1 and each circuit component 6 and at least one space between the circuit components 6 and also tightly adheres to the surface of the metal foil 1. In particular, in the state in which the circuit component 6 is mounted, since the predetermined space δ is formed between the circuit component 6 and the wetting prevention region 4 located thereunder, the resin can be filled in this space δ. In addition, when a vacuum press is performed in the pressure bonding, air bubbles are prevented from being generated in the resin sheet 7, and in addition, the resin can be more easily filled. Since the rough surface is formed in the wetting prevention region 4 surrounding the land regions 3a, the resin material enters minute irregularities of the surface of the wetting prevention region 4, and as a result, a bonding force between the resin sheet 7 and the metal foil 1 is increased.

Heating is preferably performed during or after the resin sheet 7 is pressure bonded. As a result, the thermosetting resin included in the resin sheet 7 is cured into a resin layer 7a, so that the bonding state of the resin layer 7a with the metal foils 1 and 8 and the circuit component 6 can be improved. The resin layer 7a is not necessarily cured right after the pressure bonding, and for example, when resin sheets are pressure bonded to each other to form a multilayer substrate, all the resin sheets may preferably be simultaneously thermally cured.

In this preferred embodiment, although the resin sheet 7 is used for the resin layer 7a, a thermosetting resin sheet including no inorganic filler may also preferably be used. In addition, the resin layer in the pressure bonding is not necessary in a semi-cured (such as a B stage) state and may preferably be in a state softer than the B stage.

FIG. 1H shows an eighth step in which the metal foils 1 and 8 on the lower surface and the upper surface of the resin layer 7a are etched or polished to form wiring patterns 1b and 8a, respectively. In this example, although the wiring pattern 8a on the upper surface is preferably formed by photolithography and etching, for example, the wiring pattern 1b on the lower surface is preferably formed such that the entire surface of the metal foil 1 at the other primary surface side is etched or polished until the wetting prevention region 4 is removed so that only the land regions 3a and 3b and the wiring regions remain.

In FIG. 1H, the entire metal foil 1 at the other primary surface side is removed by a predetermined thickness. However, instead of the method described above, as shown in FIG. 1I, the metal foil 1 at the lower surface side may preferably be processed into a pattern by photolithography and etching, for example. In this case, when the wetting prevention region 4 is only partially removed, the remaining portion thereof may be used as a wiring region. In addition, the thicknesses of the land regions 3a and 3b and the wiring regions may be set to be larger than that in the case shown in FIG. 1H.

After the substrate having built-in components is formed as described above, as shown in FIG. 3A, via conductor holes 9 which penetrate the resin layer 7a and the wiring pattern 8a from the top and which reach the via land regions 3b are formed. As a method for forming the via conductor holes 9, for example, a laser or a drill may preferably be used. In this preferred embodiment, the via conductor holes 9 are formed after the wiring pattern 8a is formed on the resin layer 7a. However, after the via conductor holes are formed in the resin layer 7a which is not provided with the metal foil 8 to be formed into the wiring pattern 8a, the wiring pattern 8a may also be formed.

Next, as shown in FIG. 3B, via conductors 9a are formed in the via conductor holes 9. The via conductor 9a may preferably be formed, for example, by plating the inside surface of the via conductor hole 9 or by filling a conductive paste inside the via conductor hole 9. When the via conductors 9a are formed, the wiring pattern 8a and the via land regions 3b, that is, the wiring pattern 1b, are electrically connected to each other. In addition, as a method for forming the via conductor holes 9 and the via conductors 9a, the via conductor holes 9 and the via conductors 9a may preferably be formed after the resin layer 7a is pressure bonded as described above or may be formed in advance in the resin layer 7a before it is pressure bonded. In addition, the via conductor holes 9 and the via conductors 9a are not essential elements and may be formed whenever required for conductive connection.

Subsequently, as shown in FIG. 3C, other circuit components 6 may be mounted on the wiring pattern 8a. In addition, another resin layer may be further laminated on the wiring pattern 8a to form a multilayer structure. The number of resin layers and the mounting style of the circuit component are arbitrarily selected. In FIG. 1, although the wiring pattern 8a may preferably be formed at the upper surface side of the resin layer 7a, this wiring pattern 8a may be omitted. In addition, the metal foil 8 may not be patterned so as to form a shielding electrode covering the entire or substantially the entire surface of the resin layer 7a. With this structure, the embedded component can be shielded from an outside electromagnetic field.

In this preferred embodiment, in the step shown in FIG. 1G, the metal foil 8 having no wetting prevention region is securely fixed to the upper surface of the resin layer 7a. However, as in the metal foil 1 at the stage shown in FIG. 1D, a metal foil having land regions and a wetting prevention region may also be used for the metal foil 8. In this case, a substrate having built-in components having the structure shown in FIG. 1H or 1I may be formed to have a multilayer structure.

Second Preferred Embodiment

Next, a second preferred embodiment of the method for manufacturing a substrate having built-in components according to the present invention will be described with reference to FIGS. 4A to 4J.

FIG. 4A shows a first step in which an oxide film 11a is formed entirely or substantially entirely on one primary surface of a metal foil 11. A material and a thickness of the metal foil 11 are substantially the same as those in the first preferred embodiment. As a method for forming the oxide film 11a, any method, such as a thermal treatment or a chemical treatment, for example, may preferably be used. In this example, although the oxide film 11a is formed on a flat surface of the metal foil 11, a roughened metal foil surface as shown in FIG. 1 may be processed by an oxidation treatment.

FIG. 4B shows a second step in which a plating resist 12 is pattern-formed on the oxide film 11a of the metal foil 11. A material and a pattern forming method of the plating resist 12 are substantially the same as those in the first preferred embodiment, and opening portions are formed in regions in which land regions 13a and wiring regions 13b are to be formed in a step which will be described later. The shapes of the opening portions are substantially the same as those shown in FIG. 2.

FIG. 4C shows a third step in which the oxide film 11a in the regions other than the region in which the plating resist 12 is formed is removed. That is, the oxide film 11a exposed through the opening portions are removed. As a method for removing the oxide film 11a, for example, besides immersion in an acid, such as hydrochloric acid or sulfuric acid, and dry etching using plasma, any suitable known method may also be used. Since the oxide film 11a is removed, a surface of the metal foil 11 which is not oxidized is exposed in the regions (opening portions) other than the region in which the plating resist 12 is formed.

FIG. 4D shows a fourth step in which a metal plating layer 13 having a superior wettability to solder or conductive adhesive is formed on the upper surface of the metal foil 11 in the regions other than the region in which the plating resist 12 is formed. This metal plating layer 13 is formed into the land regions 13*a* and the wiring regions 13*b* which will be described later. Since the metal plating layer 13 is formed on the surface of the metal foil 11 which is not oxidized, an adhesion strength between the metal plating 13 and the metal foil 11 is increased. The metal plating layer 13 is preferably formed so that the surface thereof is located above the upper surface of the oxide film 11*a*.

FIG. 4E shows a fifth step in which the plating resist 12 is removed from the metal foil 11. Since the plating resist 12 is removed, on the metal foil 11, the trapezoidal land regions 13*a* and wiring regions 13*b* are formed, each of which is preferably made of the metal plating layer and has a smooth surface, and a wetting prevention region 14 made of the oxide film surrounding the above regions. The land regions 13*a* and the wiring regions 13*b* are formed at a position above that of the wetting prevention region 14.

FIG. 4F shows a sixth step in which a solder paste 15 is applied to the land regions 13*a* on the metal foil 11 by a printing method or other suitable method. In addition, the solder paste 15 may not be applied to the wiring regions 13*b*.

FIG. 4G shows a seventh step in which at least one circuit component 16 is disposed on the land regions 13*a* to which the solder paste 15 is applied and is then mounted by reflow, for example. In this step, terminal electrodes 16*a* of the circuit component 16 and the land regions 13*a* are electrically connected to each other by solder 15*a*. Since the land regions 13*a* are each preferably formed at a position above that of the wetting prevention region 14, and further the wetting prevention region 14 is preferably formed of the oxide film 11*a*, the melted solder 15*a* remains on the land region 13*a* and is not spread by wetting to the wetting prevention region 14 located outside of the land region 13*a*. In addition, when the circuit component 16 is mounted on the land regions 13*a* by a conductive adhesive, the same advantages as described above can also be obtained.

FIG. 4H shows an eighth step in which a resin sheet 17 and a metal foil 18 are disposed on and pressure bonded to the metal foil 11 and the circuit component 16. A material and a pressure bonding method of the resin sheet 17 are substantially the same as those in the first preferred embodiment. The resin sheet 17 enters spaces between the metal foil 11 and the circuit components 16 and between the circuit components 16 and also securely adheres to the surface of the metal foil 11. Since the oxide film 11*a* is formed in the wetting prevention region 14 surrounding the land regions 13*a*, the resin material enters minute irregularities of the surface of the oxide film 11*a*, and as a result, a bonding force between the metal foil 11 and the resin sheet 17 can be increased. A thermosetting resin included in the resin sheet 17 is cured to form a resin layer 17*a*.

FIG. 4I shows a ninth step in which the metal foils 11 and 18 on the lower surface and the upper surface of the resin layer 17*a* are etched or polished to form wiring patterns 11*b* and 18*a*, respectively. In this example, although the wiring pattern 18*a* on the upper surface is preferably formed by photolithography and etching, the wiring pattern 11*b* on the lower surface is preferably formed such that the entire surface of the metal foil 11 at the other primary surface side is etched or polished until the wetting prevention region 14 is removed so that only the land regions 13*a* and the wiring regions 13*b* remain.

Instead of the step shown in FIG. 4I, as shown in FIG. 4J, the wiring pattern 1*b* on the lower surface may also be formed by photolithography and etching, for example. In this case, a method is used in which only a portion corresponding to the wetting prevention region 14 is removed so that the land regions 13*a* and the wiring regions 13*b* remain.

In the first preferred embodiment, a rough surface having irregularities is formed as the wetting prevention region, and in the second preferred embodiment, an oxide film is formed. However, the above two methods may preferably be used in combination. That is, an oxide film may be formed on a rough surface. Since a manufacturing method thereof is similar to that in the second preferred embodiment, a description is omitted. In this case, since the wetting prevention region has a rough surface and an oxide film, solder or conductive adhesive can be more effectively prevented from being spread by wetting.

Third Preferred Embodiment

Next, a third preferred embodiment of the method for manufacturing a substrate having built-in components according to the present invention will be described with reference to FIGS. 5A to 5I. Since steps shown in FIG. 5A to 5C are substantially the same as those shown in FIG. 1A to 1C, the same reference numerals as those in FIGS. 1A to 1C are used, and a description is omitted.

In a step shown in FIG. 5D, Sn or Sn-alloy plating is preferably performed on the surface of the metal foil 1 on which the plating resist 2 is formed, so that pre-coat layers 20 are formed. In this example, since the land regions 3*a* and the wiring regions 3*b* are exposed through the opening portions of the plating resist 2, the pre-coat layers 20 are formed on the regions. As the Sn alloy, for example, Sn—Ag, Sn—Bi, Sn—Ag—cu, and other suitable Sn alloys may preferably be used. As a plating method, any suitable method, such as an electroless plating method or an electroplating method, for example, may preferably be used. However, the thickness of the pre-coat layer 20 is preferably set to a minimum thickness (for example, about 0.1 µm to about 5 µm) necessary for pre-coat mounting.

FIG. 5E shows the state in which the plating resist 2 is removed from the metal foil 1. Since the plating resist 2 is removed, the trapezoidal land regions 3*a* and wiring regions 3*b*, each provided with the pre-coat layer 20 thereon, are formed on the metal foil 1 at a position above that of the wetting prevention region 4 which is made of a rough surface and which surrounds the peripheries of the regions described above.

FIG. 5F shows the state in which the circuit component 6 is pre-coat mounted on the land regions 3*a* each provided with the pre-coat layer 20 thereon. In this step, the pre-coat layer 20 is preferably melted into solder 20*a*. However, the overall amount thereof is very small. Furthermore, since the land regions 3*a* are formed at a position above that of the wetting prevention region 4 surrounding the peripheries of the land regions 3*a*, the solder 20*a* is not spread by wetting.

Subsequently, steps shown in FIGS. 5G to 5I are performed in a manner similar to that shown in FIGS. 1G to 1I. In this preferred embodiment, in addition to a very small overall amount of the solder 20*a* being used, the wetting prevention region 4 is formed around the peripheries of the land regions 3*a*, and the land regions 3*a* are formed at a position above that of the wetting prevention region 4. Thus, the solder 20*a* can be prevented from being spread by wetting outside the land regions 3*a* in the pre-coat mounting. Furthermore, after the substrate having built-in components is completed, even if the solder 20*a* is re-melted by heat generated when the substrate having built-in components is reflowed on a wiring substrate, for the reasons described above, the spread of solder by wetting can be reliably prevented.

Fourth Preferred Embodiment

Next, a fourth preferred embodiment of the method for manufacturing a substrate having built-in components according to the present invention will be described with reference to FIG. 6A to 6I.

Figure 6A:
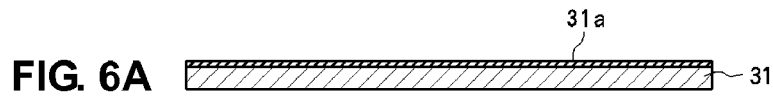
FIGS. 6A to 6I include views showing a manufacturing process of a substrate having built-in components according to a fourth preferred embodiment of the present invention.

FIG. 6A shows a first step in which an oxide film 31a is formed entirely or substantially entirely on one primary surface of a metal foil 31. The metal foil 31 and the oxide film 31a are substantially the same as those in the second preferred embodiment.

Figure 6B:
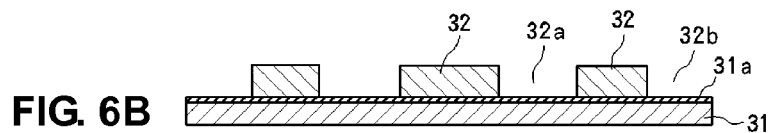
Figure 7:
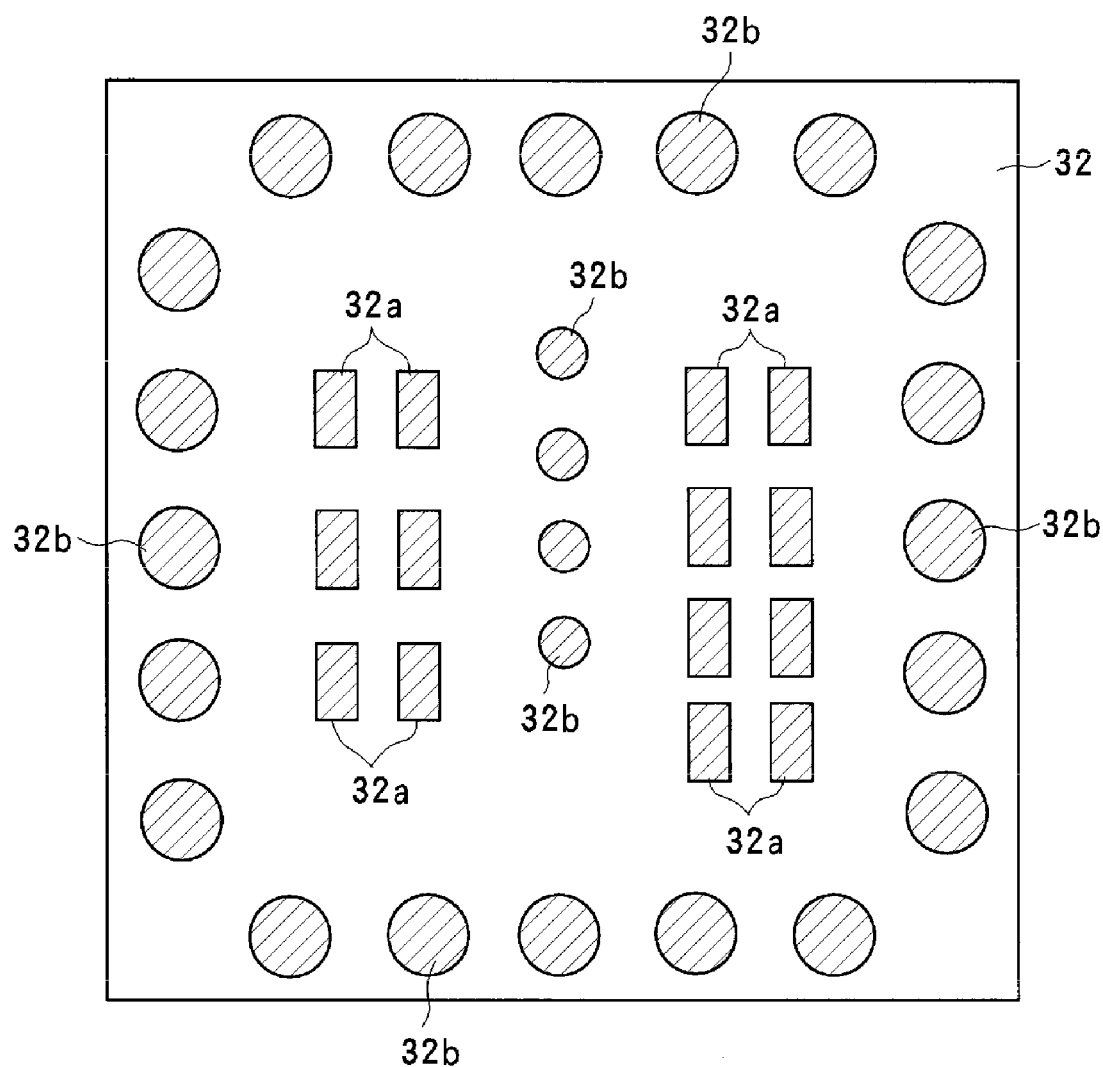
FIG. 7 is a pattern view showing another example of the plating resist.
Figure 9A:
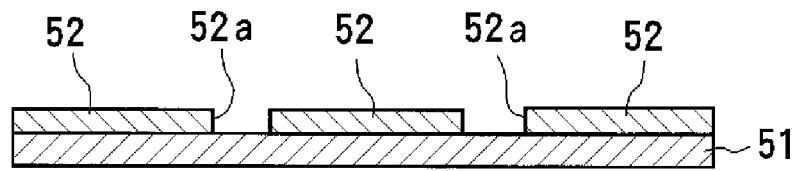
FIGS. 9A to 9E include views showing a manufacturing process of a conventional substrate having built-in components.
Figure 9B:
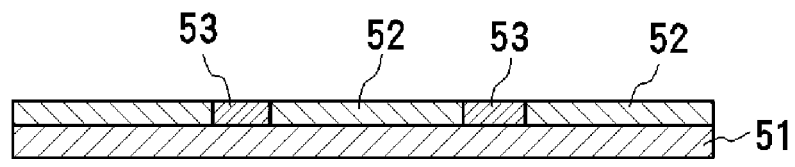
Figure 9C:
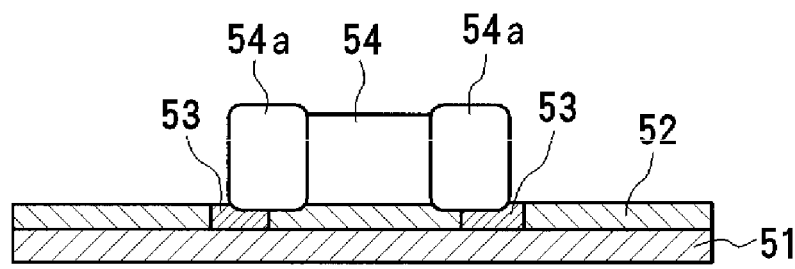
Figure 9D:
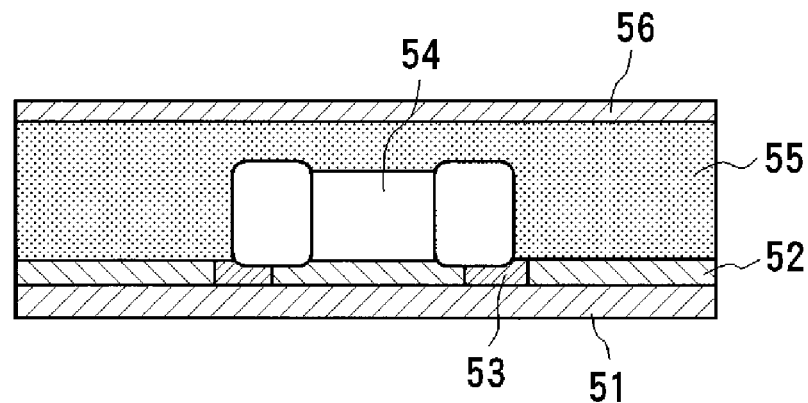
Figure 9E:
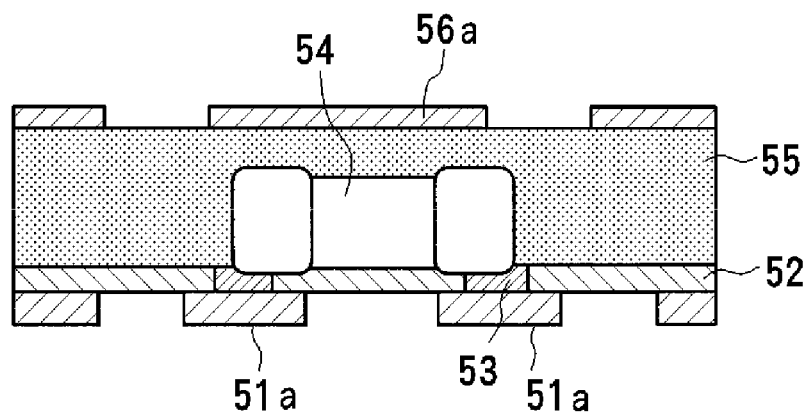

FIG. 6B shows a second step in which a plating resist 32 having only a land pattern is formed on the oxide film 31a of the metal foil 31. The pattern shape of the plating resist 32 is shown in FIG. 7. Opening portions 32a and 32b are independently formed only in regions in which component-mounting land regions 33a and via land regions 33b are to be formed which will be described later, and no opening portions are formed in portions corresponding to wiring regions.

Figure 6C:
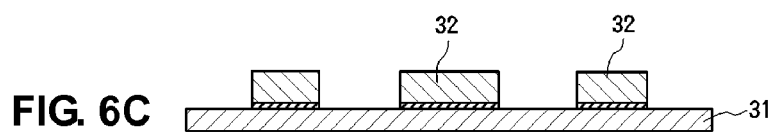

FIG. 6C shows a third step in which the oxide film 31a in the regions other than the region in which the plating resist 32 is formed is removed. That is, the oxide film 31a at positions corresponding to the opening portions 32a and 32b is removed.

Figure 6D:
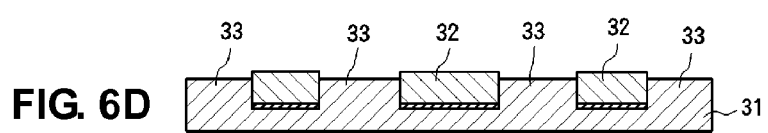

FIG. 6D shows a fourth step in which a metal plating layer 33 is formed on an upper surface of the metal foil 31 in the regions other than the region in which the plating resist 32 is formed, that is, in the opening portions 32a and 32b. This metal plating layer 33 is formed into the land regions 33a and 33b which will be described later.

Figure 6E:
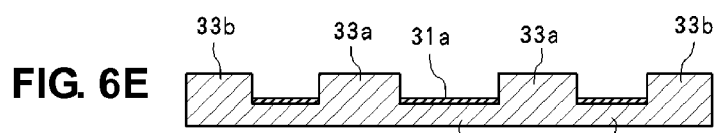

FIG. 6E shows a fifth step in which the plating resist 32 is removed from the metal foil 31. Since the plating resist 32 is removed, on the metal foil 31, the land regions 33a and 33b made of the metal plating layer and each having a flat surface are formed at a higher position, and a wetting prevention region 34 having the oxide film 31a surrounding the peripheries of the above land regions is formed at a lower position. The land regions 33a and 33b are formed so as to have a dispersed domain structure as described above, and the wetting prevention region 34 surrounds the entire or substantially the entire peripheries of the land regions. At this stage, the wiring regions are not formed.

Figure 6F:
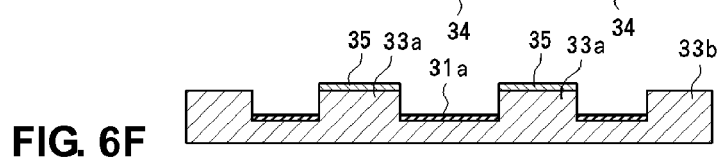

FIG. 6F shows a sixth step in which a solder paste 35 is applied to the land regions 33a on the metal foil 31 by a printing method or other suitable method, for example. In addition, no solder paste 35 is applied to the via land regions 33b.

Figure 6G:
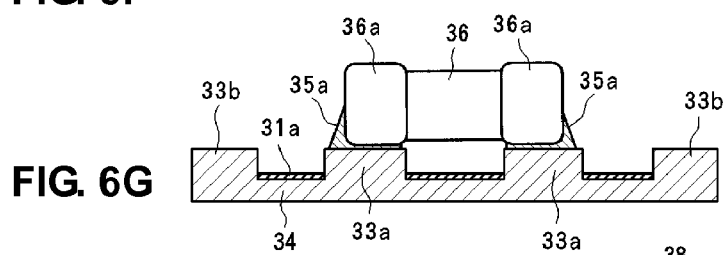

FIG. 6G shows a seventh step in which a circuit component 36 is disposed on the land regions 33a to which the solder paste 35 is applied and is then mounted by reflow or other suitable method. In this step, terminal electrodes 36a of the circuit component 36 and the land regions 33a are electrically connected to each other by solder 35a. In this preferred embodiment, since the land regions 33a have a dispersed domain structure, that is, wiring regions located at the same or substantially the same height as that of the land regions 33a are not formed continuously therefrom, and furthermore, the land regions 33a are formed at a position above that of the wetting prevention region 34 made of an oxide film, the melted solder 35a remains on the land regions 33a and can be reliably prevented from being spread outside by wetting.

Figure 6H:
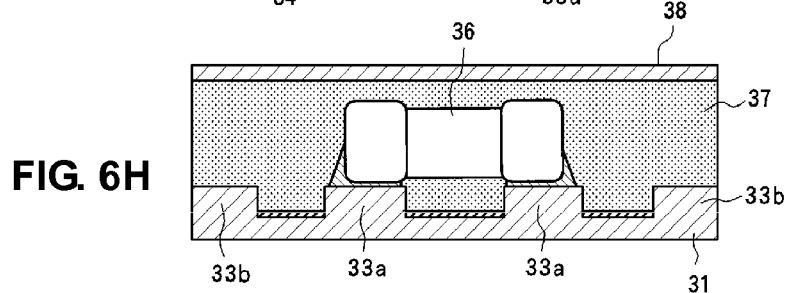

FIG. 6H shows an eighth step in which a resin sheet 37 and a metal foil 38 are disposed on and pressure bonded to the metal foil 31 and the circuit component 36.

Figure 6I:
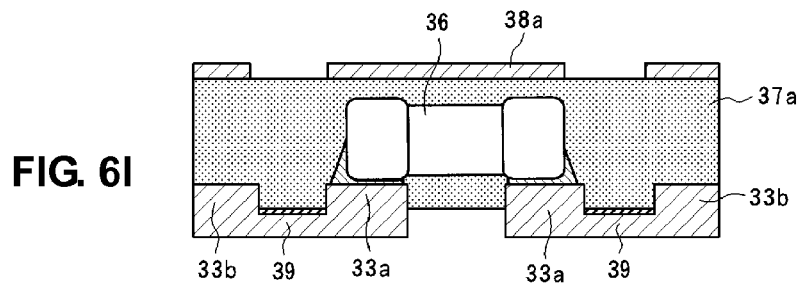

FIG. 6I shows a ninth step in which the metal foils 31 and 38 on the lower surface and the upper surface of a resin layer 37a are processed by photolithography and etching, for example, to form wiring patterns 38a and 39, respectively. Since the wiring regions are not formed in the metal foil 31 at the stage shown in FIG. 6H, when the metal foil 31 is pattern-etched, wiring regions 39 are formed. The wiring regions 39 may preferably be formed to have shapes as shown in FIG. 2, for example.

Fifth Preferred Embodiment

Next, a fifth preferred embodiment of the method for manufacturing a substrate having built-in components according to the present invention will be descried with reference to FIGS. 8A to 8I.

FIG. 8A shows a first step in which a metal film 41 having an inferior solder wettability is formed entirely or substantially entirely on one primary surface of a metal foil 40, such as a copper foil, for example. As a metal having an inferior solder wettability, for example, cobalt, nickel, tungsten, molybdenum, aluminum, chromium, iron, zinc, or an alloy thereof may preferably be used. A plating thickness of, for example, about 0.5 μm to about 5 μm (about 0.5 μm to about 1 μm is most preferable) is effective.

FIG. 8B shows a second step in which a plating resist 42 is applied to the metal film 41 having an inferior solder wettability and is formed into a pattern. In this case, a film resist may also preferably be used. A material and a pattern forming method of the plating resist 42 are substantially the same as those in the first preferred embodiment, and opening portions 42a are formed in regions in which land regions and wires are to be formed in a step which will be described later. The shapes of the opening portions 42a may preferably be the same as those shown in FIG. 2 or FIG. 7, for example.

FIG. 8C shows a third step in which a metal plating layer 43 having a superior solder wettability is formed on the metal film 41 in the regions other than the region in which the plating resist 42 is formed. As a metal having a superior solder wettability, for example, copper may preferably be used. Accordingly, the metal plating layer 43 is formed on the metal film 41 exposed through the opening portions 42a of the plating resist 42, so that the land regions and the wiring regions are formed. In addition, a Sn pre-coat layer may preferably be formed on the copper plating layer 43 by Sn plating, for example.

FIG. 8D shows a fourth step in which the plating resist 42 is removed from the metal film 41. Since the plating resist 42 is removed, the land regions and the wiring regions each made of the metal plating layer 43 having a superior solder wettability are formed on a wetting prevention region made of the metal film 41 having an inferior solder wettability. The land regions and the wiring regions are formed at a position above that of the wetting prevention region.

FIG. 8E shows a fifth step in which a solder paste 44 is applied to the land regions made of the metal plating layer 43 having a superior solder wettability by a printing method or other suitable method, for example. In this preferred embodiment, the solder paste 44 may not be applied to the wiring regions. In the third step, when a Sn pre-coat layer is formed on the metal plating layer 43 having a superior solder wettability, the application of the solder paste 44 is not required.

FIG. 8F shows a sixth step in which at least one circuit component 45 is disposed on the land regions 43 to which the solder paste 44 is applied and is then mounted by reflow or other suitable method, for example. In this step, terminal electrodes 45a of the circuit component 45 and the land regions 43 are electrically connected to each other by solder 44a. Since the land regions 43 are formed at a position above that of the wetting prevention region 41, and further the wetting prevention region 41 is formed of a metal having an inferior solder wettability, the melted solder 44a remains on the land region 43 and is not spread by wetting to the wetting prevention region 41 located outside. In addition, when the circuit component 45 is mounted on the land regions 43 by a conductive adhesive, substantially the same advantages as described above can also be obtained.

FIG. 8G shows a seventh step in which a thermosetting resin sheet 46 and a metal foil 47 are disposed on and pressure bonded to the metal film 41 and the circuit component 45. A material and a pressure bonding method of the resin sheet 46 are substantially the same as those in the first preferred embodiment. The resin sheet 46 enters spaces between the metal film 41 and the circuit components 45 and between the circuit components 45 and also securely adheres to the surface of the metal film 41. A thermosetting resin included in the resin sheet 46 is cured to form a resin layer.

FIG. 8H shows an eighth step in which the metal foil 47 on the upper surface of the resin layer 46 is etched or polished, for example, to form a wiring pattern 47a, and the metal foil 40 on the lower surface is etched or polished, for example, to form a wiring pattern. In this example, the wiring pattern 47a on the upper surface is preferably formed by photolithography and etching, for example, and the metal foil 40 on the lower surface is preferably etched or polished, for example, until the wetting prevention region 41 is removed so that mounting land regions 40a and via land regions 40b remain. In addition, the wiring regions (not shown) may also remain.

FIG. 8I shows a ninth step in which via holes 48 are formed from the wiring pattern 47a on the upper surface to the via land regions 40b on the lower surface, and conductive pastes are filled in the via holes to form via conductors.

In this preferred embodiment, since the wetting prevention region 41 made of a metal having an inferior solder wettability is formed around the peripheries of the land regions 43, the spread of solder or conductive adhesive can be effectively prevented.

Manufacturing Method 1

In accordance with the first preferred embodiment of the present invention, a sample of the substrate having built-in components was formed as described below.

(1) After a Cu foil (manufactured by Nippon Mining and Metals Co., Ltd.) having a thickness of about 18 μm was used as a metal foil (about 100 mm×about 100 mm), and a film resist (manufactured by Tokyo Ohka Co., Ltd.) having a thickness of about 25 μm was laminated on a roughened surface of the Cu foil, an exposure and a development treatment were performed, so that a plating resist layer was formed in a region other than land regions and wiring regions.

(2) A Cu plating layer having a thickness of about 20 μm was formed using a Cu sulfate plating bath. A space between component-mounting land regions was set to about 100 μm.

(3) The plating resist layer was removed in a 3 percent NaOH solution.

(4) A solder paste was printed on the component-mounting land regions, and 100 chip capacitors were then mounted thereon.

(5) A resin sheet made of an epoxy-based resin having a thickness of 500 μm and a Cu foil having a thickness of 18 μm were laminated on the metal foil and the chip capacitors, so that the components were embedded in the resin. Subsequently, the resin sheet was cured to form a resin layer.

(6) The Cu foil on the upper surface of the resin layer was processed by photolithography and etching to form wires, and in addition, the lower-surface Cu foil was removed by etching to form a wiring pattern.

Manufacturing Method 2

In accordance with the second preferred embodiment of the present invention, a sample of the substrate having built-in components was formed as described below.

(1) A Cu foil (manufactured by Nippon Mining and Metals Co., Ltd.) having a thickness of about 12 μm was processed by a heat treatment in an air atmosphere at about 200° C. for about 60 minutes, so that an oxide film was formed on a surface of the Cu foil.

(2) After the above Cu foil was used as a metal foil (about 100 mm×about 100 mm), and a film resist (manufactured by Tokyo Ohka Co., Ltd.) having a thickness of about 25 μm was laminated on the oxide film, an exposure and a development treatment were performed, so that a plating resist layer was formed in a region other than land regions and wiring regions.

(3) A Cu plating layer having a thickness of about 20 μm was formed using a Cu sulfate plating bath. A space between component-mounting land regions was set to about 100 μm.

(4) The plating resist layer was removed in a 3 percent NaOH solution.

(5) A solder paste was printed on the component-mounting land regions, and 100 chip capacitors were then mounted thereon.

(6) A resin sheet made of an epoxy-based resin having a thickness of about 500 μm and a Cu foil having a thickness of about 18 μm were laminated on the metal foil and the chip capacitors, so that the components were embedded in the resin. Subsequently, the resin sheet was cured to form a resin layer.

(7) The Cu foil on the upper surface of the resin layer was processed by photolithography and etching to form wires, and in addition, the lower-surface Cu foil was removed by etching to form a wiring pattern.

Manufacturing Method 3

In accordance with the first and second preferred embodiments, a sample of the substrate having built-in components was formed as described below. That is, a metal foil having a rough surface on which an oxide film was formed was used.

(1) A Cu foil (manufactured by Nippon Mining and Metals Co., Ltd.) having a thickness of about 35 μm was processed by a heat treatment in an air atmosphere at about 200° C. for about 60 minutes, so that an oxide film was formed on a roughened surface of the Cu foil.

(2) After the above Cu foil was used as a metal foil (about 100 mm×about 100 mm), and a film resist (manufactured by Tokyo Ohka Co., Ltd.) having a thickness of about 25 μm was laminated to the oxide film on the roughened surface, an exposure and a development treatment were performed, so that a plating resist layer was formed in a region other than land regions and wiring regions.

(3) A Cu plating layer having a thickness of about 20 μm was formed using a Cu sulfate plating bath. A space between component-mounting land regions was set to about 100 μm.

(4) The plating resist layer was removed in a 3 percent NaOH solution.

(5) A solder paste was printed on the component-mounting land regions, and 100 chip capacitors were then mounted thereon.

(6) A resin sheet made of an epoxy-based resin having a thickness of about 500 μm and a Cu foil having a thickness of about 18 μm were laminated on the metal foil and the chip capacitors, so that the components were embedded in the resin. Subsequently, the resin sheet was cured to form a resin layer.

(7) The Cu foil on the upper surface of the resin layer was processed by photolithography and etching to form wires, and in addition, the lower-surface Cu foil was removed by etching to form a wiring pattern.

Manufacturing Method 4

In accordance with the third preferred embodiment of the present invention, a sample of the substrate having built-in components was formed as described below.

(1) After a Cu foil (manufactured by Nippon Mining and Metals Co., Ltd.) having a thickness of about 100 μm was prepared as a metal foil (about 100 mm×about 100 mm), and a film resist (manufactured by Tokyo Ohka Co., Ltd.) having a thickness of about 25 μm was laminated on a roughened surface of the Cu foil, an exposure and a development treatment were performed, so that a plating resist layer was formed in a region other than land regions and wiring regions.

(2) A Cu plating layer having a thickness of about 20 μm was formed using a Cu sulfate plating bath. A space between component-mounting land regions was set to about 100 μm.

(3) Immersion Sn-Ag plating was performed on surfaces of the component-mounting land regions to form a thickness of about 1 μm, so that pre-coat layers were formed.

(4) The plating resist layer was removed in a solvent-based stripping solution.

(5) After a flux was applied to the component-mounting land regions, 100 chip capacitors were mounted thereon.

(6) A resin sheet made of an epoxy-based resin having a thickness of about 500 μm and a Cu foil having a thickness of about 18 μm were laminated on the metal foil and the chip capacitors, so that the components were embedded in the resin. Subsequently, the resin sheet was cured to form a resin layer.

(7) The Cu foil on the upper surface of the resin layer was processed by photolithography and etching to form wires, and in addition, the lower-surface Cu foil was removed by polishing to form a wiring pattern.

Manufacturing Method 5

In accordance with the fourth preferred embodiment of the present invention, a sample of the substrate having built-in components was formed as described below.

(1) After a Cu foil (manufactured by Nippon Mining and Metals Co., Ltd.) having a thickness of about 18 μm was processed by a heat treatment in an air atmosphere at about 200° C. for about 60 minutes, so that an oxide film was formed on a surface of the cu foil.

(2) After the above Cu foil was used as a metal foil (about 100 mm×about 100 mm), and a film resist (manufactured by Tokyo Ohka Co., Ltd.) having a thickness of about 25 μm was laminated on the oxide film, an exposure and a development treatment were performed, so that a plating resist layer was formed in a region other than land regions.

(3) A Cu plating layer having a thickness of about 20 μm was formed only on land regions using a Cu sulfate plating bath. A space between component-mounting land regions was set to about 100 μm.

(4) The plating resist layer was removed in a 3 percent NaOH solution.

(5) A solder paste was printed on the component-mounting lands, and 100 chip capacitors were then mounted thereon.

(6) A resin sheet made of an epoxy-based resin having a thickness of about 500 μm and a Cu foil having a thickness of about 18 μm were laminated on the metal foil and the chip capacitors, so that the components were embedded in the resin. Subsequently, the resin sheet was cured to form a resin layer.

(7) The Cu foil on the upper surface of the resin layer was processed by photolithography and etching to form wires, and in addition, the Cu foil on the lower surface was processed by photolithography and etching to form a wiring pattern including wiring regions between the lands.

In order to compare to the substrate having built-in components of the above preferred embodiments, a substrate having built-in components was formed as described below in accordance with Japanese Unexamined Patent Application Publication No. 2005-26573.

(1) A Cu foil (manufactured by Nippon Mining and Metals Co., Ltd.) having a thickness of 18 μm was used as a metal foil (about 100 mm×about 100 mm), and a about 15 μm-thick epoxy-based solder resist (manufactured by Taiyo Ink MFG. Co., Ltd.) having openings only for land regions was formed on a glossy surface, that is, a non-roughened surface, of the Cu foil.

(2) A solder paste was printed on component-mounting land regions by printing, and 100 chip capacitors were then mounted thereon. A space between the component-mounting land regions was set to about 100 μm.

(3) A resin sheet made of an epoxy-based resin having a thickness of about 500 μm and a Cu foil having a thickness of about 18 μm were laminated on the component-mounting land regions and the chip capacitors, so that the components were embedded in the resin. Subsequently, the resin sheet was cured to form a resin layer.

(4) The Cu foils on the upper and the lower surfaces of the resin layer were processed by photolithography and etching to form wiring patterns.

After the substrates having built-in components experimentally formed by the methods described above were subjected to tests performed under the following conditions, the presence or absence of short circuit caused by solder flow was confirmed by transmission x-ray observation.

Condition 1: about 85° C., about 85% RH for about 168 hours→reflow (peak at about 260° C.)×5 times Condition 2: about 60° C., about 60% RH for about 40 hours→reflow (peak at about 260° C.)×4 times

TABLE 1

| | Condition 1 | Condition 2 |
|---|---|---|
| Manufacturing Method 1 | x | o |
| Manufacturing Method 2 | x | o |
| Manufacturing Method 3 | x | o |
| Manufacturing Method 4 | o | o |
| Manufacturing Method 5 | o | o |
| Comparative Example | x | x | o: No short circuit,
x: Presence of short circuit

From the above results, the following facts are determined.

According to Manufacturing Methods 1 to 3, since the peripheries of the land regions are surrounded by the wetting prevention region having an inferior wettability, and a dissimilar interface, such as an insulating layer/resin layer interface of a conventional technique, is not generated in the substrate, a superior solder-flow resistance is obtained. However, in a test performed under Condition 1 in which the component is maintained at a high temperature and a high humidity for a long period of time and in which the number of reflows is relatively large, a short circuit may occur in some cases.

(2) According to Manufacturing Method 4, since Sn—Ag plating is used as the solder, the solder amount is small, and thus, the solder flow resistance is further improved as compared to that of Manufacturing Methods 1 to 3.

(3) According to Manufacturing Method 5, since the solder is provided only on the land regions and the steps are formed between the land regions and the wiring regions, the solder flow resistance is further improved as compared to that of Manufacturing Methods 1 to 3.

In each of the above-described preferred embodiments of the present invention, although the land regions are preferably formed at a position above that of the wetting prevention region, both regions may be formed at the same or substantially the same height. Even in this case, since solder or conductive adhesive is not likely to be spread by wetting to the wetting prevention region formed of a rough surface or an oxide film, the risk of generating solder flow is still reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a substrate having built-in components comprising:
    a step (a) of forming land regions to connect a circuit component and a wetting prevention region on one primary surface of a metal foil, the wetting prevention region surrounding the land regions and having an inferior wettability to solder or conductive adhesive as compared to that of the land regions;
    a step (b) of electrically connecting terminal electrodes of the circuit component to the land regions using the solder or the conductive adhesive;
    a step (c) of forming a resin layer on the metal foil and the circuit component so that the circuit component is embedded in the resin layer; and
    a step (d) of processing the metal foil to form a wiring pattern.

2. The method for manufacturing a substrate having built-in components according to claim 1, wherein in the step (a), the wetting prevention region is formed by roughening the metal foil.

3. The method for manufacturing a substrate having built-in components according to claim 2, wherein the step (a) comprises:
    a step (e) of roughening the one primary surface of the metal foil to form a rough surface;
    a step (f) of forming a plating resist layer in a region on the rough surface which corresponds to the wetting prevention region;
    a step (g) of forming a metal plating layer having a superior solder wettability to the solder or the conductive adhesive on the rough surface in regions other than the region in which the plating resist layer is formed to form the land regions; and
    a step (h) of removing the plating resist layer to form the wetting prevention region from the rough surface.

4. The method for manufacturing a substrate having built-in components according to claim 1, wherein in the step (a), the wetting prevention region is formed by oxidizing the metal foil.

5. The method for manufacturing a substrate having built-in components according to claim 4, wherein the step (a) comprises:
    a step (i) of forming an oxide film on the one primary surface of the metal foil;
    a step (j) of forming a plating resist layer in a region on the oxide film which corresponds to the wetting prevention region;
    a step (k) of removing the oxide film in regions other than the region in which the plating resist layer is formed;
    a step (l) of forming a metal plating layer having a superior wettability to the solder or the conductive adhesive in the regions in which the oxide film is removed to form the land regions; and
    a step (m) of removing the plating resist layer to form the wetting prevention region from the oxide film.

6. The method for manufacturing a substrate having built-in components according to claim 1, wherein in the step (a), the wetting prevention region is formed of a metal having a relatively inferior wettability to solder or conductive adhesive compared to that of a metal forming the land regions.

7. The method for manufacturing a substrate having built-in components according to claim 6, wherein the land regions are formed of copper or a copper alloy, and the wetting prevention region is formed of cobalt, nickel, tungsten, molybdenum, aluminum, chromium, iron, zinc, or an alloy thereof.

8. The method for manufacturing a substrate having built-in components according to claim 6, wherein the step (a) comprises:
    a step (n) of providing the metal having an inferior wettability to solder or conductive adhesive on the one primary surface of the metal foil;
    a step (o) of forming a plating resist layer in a region on the metal foil corresponding to the wetting prevention region;
    a step (p) of forming a metal plating layer having a superior wettability to the solder or the conductive adhesive on the metal foil in regions other than the region in which the plating resist layer is formed to form the land regions; and
    a step (q) of removing the plating resist layer to form the wetting prevention region in which the metal having an inferior solder wettability to solder or conductive adhesive is exposed.

9. The method for manufacturing a substrate having built-in components according to claim 1, wherein in the step (a), the land regions are provided with wiring regions which are continuously formed therefrom; and
    in the step (d), a predetermined thickness of the metal foil is removed by etching or polishing from the other primary surface thereof to form a wiring pattern including the land regions and the wiring regions.

10. The method for manufacturing a substrate having built-in components according to claim 1, wherein in the step (a), the land regions are formed to have a dispersed domain structure, and the wetting prevention region surrounds the entire peripheries of the land regions; and in the step (d), the metal foil is pattern-etched to form a wiring pattern including the land regions and wiring regions connected to the land regions.

11. The method for manufacturing a substrate having built-in components according to claim 1, wherein the step (b) comprises:

performing Sn or Sn-alloy plating on each of the land regions to form a pre-coat layer to be formed into a solder; and performing pre-coat mounting of the terminal electrodes of the circuit component to the land regions.

12. The method for manufacturing a substrate having built-in components according to claim 3, wherein the metal foil is a copper foil, and the metal plating layer is a copper plating layer or a copper alloy plating layer.

* * * * *